(12) United States Patent
Zhao et al.

(10) Patent No.: US 11,158,689 B2
(45) Date of Patent: Oct. 26, 2021

(54) ELECTROLUMINESCENT DISPLAY PANEL, MANUFACTURING METHOD THEREOF AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Pan Zhao, Beijing (CN); Zhiliang Jiang, Beijing (CN); Zhenli Zhou, Beijing (CN); Ge Wang, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/490,095

(22) PCT Filed: Jan. 2, 2019

(86) PCT No.: PCT/CN2019/070059
§ 371 (c)(1),
(2) Date: Aug. 30, 2019

(87) PCT Pub. No.: WO2019/227930
PCT Pub. Date: Dec. 5, 2019

(65) Prior Publication Data
US 2020/0066813 A1    Feb. 27, 2020

(30) Foreign Application Priority Data
May 28, 2018 (CN) .................. 201810523141.X

(51) Int. Cl.
*H01L 27/32* (2006.01)
*H01L 51/52* (2006.01)
*H01L 51/56* (2006.01)

(52) U.S. Cl.
CPC ...... *H01L 27/3244* (2013.01); *H01L 51/5253* (2013.01); *H01L 51/56* (2013.01); *H01L 2227/323* (2013.01)

(58) Field of Classification Search
CPC ..... H01L 51/00–56; H01L 27/32–3293; H01L 23/562; H05B 33/04
See application file for complete search history.

(56) References Cited

U.S. PATENT DOCUMENTS 9,123,676 B2 *  9/2015  Han .................. H01L 27/3246
9,276,055 B1 *  3/2016  Son .................. H01L 27/323
(Continued)

FOREIGN PATENT DOCUMENTS

CN    103178080 A    6/2013
CN    106601781 A    4/2017
(Continued)

OTHER PUBLICATIONS

Machine translation, Tu, Chinese Pat. Pub. No. CN 108832017, translation date: Sep. 27, 2020, Espacenet, all pages. (Year: 2020).*
(Continued)

*Primary Examiner* — Victoria K. Hall
(74) *Attorney, Agent, or Firm* — Arent Fox LLP; Michael Fainberg

(57) ABSTRACT

An electroluminescent display panel, a manufacturing method thereof and a display device are provided. The electroluminescent display panel includes a display area and a non-display area; the non-display area is provided with a crack dam; the crack dam includes at least two stacked metal pads and an insulating layer; the at least two metal pads includes a first metal pad and a second metal pad; the first metal pad and the second metal pad are on a same side of the base substrate; the insulating layer is between the first metal pad and the second metal pad and completely covers the (Continued)

second metal pad, wherein a plane of the insulating layer covering and being away from the second metal pad, is a first surface; and the first metal pad covers at least the boundary of the first surface close to the display area.

10 Claims, 5 Drawing Sheets

(56) References Cited

U.S. PATENT DOCUMENTS

| | | | |
|---|---|---|---|
| 9,287,329 B1* | 3/2016 | Lee | H01L 51/5262 |
| 9,356,087 B1* | 5/2016 | Lee | H01L 27/1218 |
| 9,634,287 B1* | 4/2017 | Shin | G02F 1/13394 |
| 2006/0197202 A1* | 9/2006 | Horng | H01L 25/16 |
| | | | 257/678 |
| 2013/0161632 A1 | 6/2013 | You et al. | |
| 2015/0041772 A1* | 2/2015 | Han | H01L 27/3248 |
| | | | 257/40 |
| 2015/0091030 A1* | 4/2015 | Lee | H01L 27/3246 |
| | | | 257/91 |
| 2015/0171366 A1* | 6/2015 | Kim | H01L 51/0023 |
| | | | 257/40 |
| 2015/0214255 A1 | 7/2015 | Chikama et al. | |
| 2015/0230337 A1* | 8/2015 | Kim | H05K 1/189 |
| | | | 361/751 |
| 2015/0264805 A1* | 9/2015 | Chen | H05K 3/0052 |
| | | | 361/748 |
| 2015/0380685 A1* | 12/2015 | Lee | H01L 51/5237 |
| | | | 257/40 |
| 2016/0064691 A1* | 3/2016 | Lee | H01L 51/5275 |
| | | | 257/40 |
| 2016/0066409 A1* | 3/2016 | Kwon | H01L 23/562 |
| | | | 174/254 |
| 2016/0155788 A1* | 6/2016 | Kwon | H01L 27/3258 |
| | | | 257/40 |
| 2016/0254479 A1* | 9/2016 | Jeong | H01L 51/5246 |
| | | | 257/40 |
| 2016/0270209 A1* | 9/2016 | Cho | G06F 1/1652 |
| 2016/0284770 A1* | 9/2016 | Kim | H01L 27/3223 |
| 2016/0293884 A1* | 10/2016 | Zhang | H05B 45/60 |
| 2016/0307971 A1* | 10/2016 | Jeon | H01L 51/5246 |
| 2016/0336522 A1* | 11/2016 | Sugawara | H01L 51/0074 |
| 2016/0336541 A1* | 11/2016 | Kim | H01L 27/124 |
| 2016/0365395 A1* | 12/2016 | Xu | H01L 51/5256 |
| 2017/0069873 A1* | 3/2017 | Kim | H01L 51/525 |
| 2017/0077447 A1* | 3/2017 | Kang | H01L 27/3246 |
| 2017/0110488 A1* | 4/2017 | Sun | H01L 29/78621 |
| 2017/0115438 A1* | 4/2017 | Choi | H01L 51/5281 |
| 2017/0117502 A1* | 4/2017 | Park | H01L 51/56 |
| 2017/0179432 A1* | 6/2017 | Visweswaran | H01L 27/3211 |
| 2017/0187000 A1* | 6/2017 | Kato | H01L 27/3276 |
| 2017/0244061 A1* | 8/2017 | Jin | H01L 51/5237 |
| 2017/0250366 A1* | 8/2017 | Andou | H01L 51/0097 |
| 2017/0277288 A1* | 9/2017 | Choi | H01L 27/323 |
| 2017/0331073 A1* | 11/2017 | Choi | H01L 27/3248 |
| 2017/0345881 A1* | 11/2017 | Kim | H01L 27/3262 |
| 2018/0013092 A1* | 1/2018 | Park | H01L 51/0097 |
| 2018/0026225 A1* | 1/2018 | Kwon | H01L 51/5237 |
| | | | 257/40 |
| 2018/0031903 A1* | 2/2018 | Nagata | H01L 23/3171 |
| 2018/0046221 A1* | 2/2018 | Choi | G02B 26/0825 |
| 2018/0047802 A1* | 2/2018 | Yoon | H01L 27/3262 |
| 2018/0059862 A1* | 3/2018 | Zeng | G06F 3/0412 |
| 2018/0070461 A1* | 3/2018 | Lee | H01L 27/3295 |
| 2018/0088390 A1* | 3/2018 | Ohara | H01L 51/0097 |
| 2018/0097034 A1* | 4/2018 | Lee | H01L 27/3276 |
| 2018/0097199 A1* | 4/2018 | Jo | H01L 27/3276 |
| 2018/0102502 A1* | 4/2018 | Kim | H01L 27/3258 |
| 2018/0124933 A1* | 5/2018 | Park | H01L 51/5212 |
| 2018/0166019 A1* | 6/2018 | Lee | H01L 27/3276 |
| 2018/0166272 A1* | 6/2018 | Rue | H01L 21/02068 |
| 2018/0188189 A1* | 7/2018 | Hwang | G01N 21/21 |
| 2018/0190170 A1* | 7/2018 | Yang | H01L 51/0031 |
| 2018/0226454 A1* | 8/2018 | Liu | G06F 3/0445 |
| 2018/0226612 A1* | 8/2018 | Choi | H01L 51/5253 |
| 2018/0226617 A1* | 8/2018 | Nakagawa | H01L 51/5256 |
| 2018/0233541 A1* | 8/2018 | Zeng | G06F 3/0412 |
| 2018/0287093 A1* | 10/2018 | Lee | H01L 51/5225 |
| 2018/0301651 A1* | 10/2018 | Kamiya | H01L 51/5072 |
| 2018/0308903 A1* | 10/2018 | Jeong | H01L 27/3276 |
| 2018/0342564 A1* | 11/2018 | Hanari | H01L 51/5228 |
| 2018/0342700 A1* | 11/2018 | Cai | H01L 51/5256 |
| 2019/0013373 A1* | 1/2019 | Lee | H01L 27/3258 |
| 2019/0019789 A1* | 1/2019 | Kim | H01L 27/0248 |
| 2019/0019981 A1* | 1/2019 | Kim | H01L 51/5253 |
| 2019/0064958 A1* | 2/2019 | Liu | G06F 3/044 |
| 2019/0097173 A1* | 3/2019 | Jia | H01L 51/56 |
| 2019/0131569 A1* | 5/2019 | Ma | H01L 51/5253 |
| 2019/0229174 A1* | 7/2019 | Choi | H01L 27/3223 |
| 2019/0280246 A1* | 9/2019 | Cheng | H01L 51/52 |
| 2019/0296099 A1* | 9/2019 | Lee | H01L 27/3246 |
| 2019/0312228 A1* | 10/2019 | Sonoda | H01L 51/56 |
| 2020/0035946 A1* | 1/2020 | Cheng | H01L 27/12 |
| 2020/0067015 A1* | 2/2020 | Jin | H01L 51/5253 |
| 2020/0091256 A1* | 3/2020 | Kim | H01L 27/3258 |
| 2020/0091459 A1* | 3/2020 | Senoo | H01L 27/3258 |
| 2020/0135835 A1* | 4/2020 | Seo | H01L 27/3276 |

FOREIGN PATENT DOCUMENTS

| | | | | |
|---|---|---|---|---|
| CN | 108511503 A | | 9/2018 | |
| CN | 108832017 A | * | 11/2018 | H01L 51/52 |
| KR | 20060078548 A | | 7/2006 | |
| KR | 10-2008-0084491 | * | 9/2008 | H05B 33/04 |
| WO | WO-2016032175 A1 | * | 3/2016 | H01L 27/32 |

OTHER PUBLICATIONS

Machine translation, Nam, Korean Pat. Pub. No. 2008-0084491A, translation date: Jun. 17, 2021, Espacenet, all pages. (Year: 2021).*

* cited by examiner

--Related Art--

ELECTROLUMINESCENT DISPLAY PANEL, MANUFACTURING METHOD THEREOF AND DISPLAY DEVICE

The disclosure is a US National Stage of International Application No. PCT/CN2019/070059, filed Jan. 2, 2019, which claims priority to Chinese Patent Application No. 201810523141.X, filed with the Chinese Patent Office on May 28, 2018, and entitled "Electroluminescent Display Panel, Manufacturing Method thereof and Display Device", of which all contents are incorporated herein by reference.

FIELD

The disclosure relates to the technical field of displays, in particular to an electroluminescent display panel, a manufacturing method thereof and a display device.

BACKGROUND

As for flat display panels, organic light emitting diode (OLED) display panels have been extensively valued due to the advantages such as self-luminescence, fast response, wide viewing angle, high brightness, bright color and thinness, etc.

SUMMARY

Embodiments of the disclosure provide an electroluminescent display panel. The electroluminescent display panel includes a display area and a non-display area surrounding the display area; the non-display area is provided with a crack dam on a base substrate; the crack dam includes at least two stacked metal pads, and an insulating layer; and the at least two metal pads include a first metal pad and a second metal pad; the first metal pad and the second metal pad are located on a same side of the base substrate, and a distance between the first metal pad and the base substrate is greater than a distance between the second metal pad and the base substrate; the insulating layer is located between the first metal pad and the second metal pad, and the insulating layer is completely disposed to cover the second metal pad; wherein a surface of the insulating layer parallel to the base substrate, being disposed to cover and being away from the second metal pad, is a first surface, and the first metal pad is disposed to cover at least a boundary of the first surface close to the display area.

In a possible embodiment, in the electroluminescent display panel in accordance with the embodiment of the disclosure, an orthographic projection of the first metal pad on the base substrate is completely disposed to cover an orthographic projection of the first surface on the base substrate.

In a possible embodiment, in the electroluminescent display panel in accordance with the embodiment of the disclosure, the orthographic projection of the first metal pad on the base substrate is further disposed to cover an orthographic projection of the side surface of the insulating layer connected with the first surface.

In a possible embodiment, in the electroluminescent display panel in accordance with the embodiment of the disclosure, the crack dam further includes a protective layer being disposed to cover the metal pads.

In a possible embodiment, the electroluminescent display panel in accordance with the embodiment of the disclosure further includes an encapsulation layer being on a side of the protective layer away from the base substrate and being disposed to cover the protective layer.

In a possible embodiment, in the electroluminescent display panel in accordance with the embodiment of the disclosure, the metal pads in the crack dam are two metal pads.

In a possible embodiment, in the electroluminescent display panel in accordance with the embodiment of the disclosure, the first metal pad is in the same layer as source and drain electrodes.

In a possible embodiment, in the electroluminescent display panel in accordance with the embodiment of the disclosure, the other metal pad than the first metal pad is in the same layer as a gate electrode.

In another aspect, embodiments of the disclosure further provide a display device including any of the electroluminescent display panels in accordance with the embodiments of the disclosure.

In another aspect, an embodiment of the disclosure further provides a manufacturing method of an electroluminescent display panel. The method includes: forming at least two metal pads in a non-display area of the base substrate, wherein the at least two metal pads include a first metal pad and a second metal pad; the first metal pad and the second metal pad are on a same side of the base substrate, and the distance between the first metal pad and the base substrate is greater than the distance between the second metal pad and the base substrate; and forming an insulating layer between the first metal pad and the second metal pad, the second metal pad is completely disposed to cover the second metal pad; wherein a surface of the insulating layer parallel to the base substrate, being disposed to cover and being away from the second metal pad, is a first surface, and the first metal pad is disposed to cover at least a boundary of the first surface close to the display area.

In a possible embodiment, in the manufacturing method in accordance with the embodiment of the disclosure, the pattern of the first metal pad and the pattern of the source and drain electrodes are formed through one patterning process.

In a possible embodiment, in the manufacturing method in accordance with the embodiment of the disclosure, the pattern of the second metal pad and the pattern of the gate electrode are formed through one patterning process.

DETAILED DESCRIPTION

Figure 1:
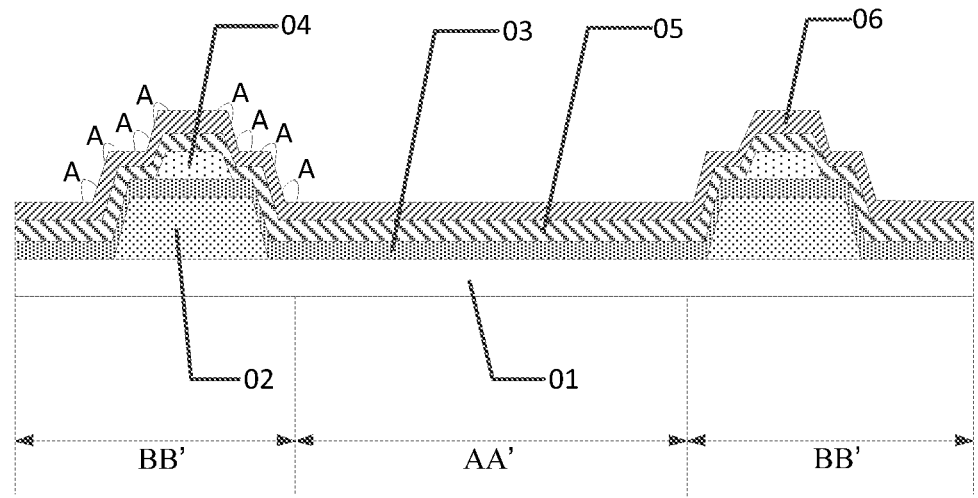
FIG. 1 is a structure schematic diagram of an electroluminescent display panel in the related art.

In the related art, as shown in FIG. 1, a display panel includes a display area AN and a non-display area BB' surrounding the display area AN; at least one crack dam is arranged in the non-display area BB' of the display panel; the crack dam includes a second metal pad 02, a gate insulating layer 03, a first metal pad 04, an interlayer dielectric layer 05 and an encapsulation layer 06 which are sequentially stacked on one side of a base substrate 01; the width of the second metal pad 02 is larger than that of the first metal pad 04; and the extension direction and extension distance of cracks can be changed through the crack dam, so that the cracks are prevented from extending into the display area.

The embodiments of the disclosure provide an electroluminescent display panel, a manufacturing method thereof and a display device, to address the problem that a plurality of gradient angles exist in crack dams due to inconsistent widths of adjacent metal pads, consequently, stress is liable to be concentrated at the gradient angles, and produced cracks extend to the display area. In order to make the objects, technical solution and advantages of the disclosure clearer, the specific embodiments of the electroluminescent display panel, the manufacturing method thereof and the display device according to the embodiments of the present disclosure will be described in detail below with reference to the attached drawings. It should be understood that the preferred embodiments described below are to be construed as illustrative only and not to limit the disclosure. The embodiments of the disclosure and the features of the embodiments may be combined with each other without conflict.

The thicknesses, sizes and shapes of various layers of films in the drawings do not reflect the true scale of the display panel, and are merely intended to illustrate the disclosure.

In view of this, the embodiments of the disclosure provide an electroluminescence display panel, as shown in FIGS. 2 to 5, the electroluminescence display panel includes a display area AA' and a non-display area BB' surrounding the display area AA', the non-display area BB' is provided with at least one crack dam on a base substrate 01, the crack dam includes at least two stacked metal pads (the figures are illustrated with only two metal pads stacked as examples but not limited) and an insulating layer 07, and the at least two metal pads include a first metal pad 04 and a second metal pad 02.

The first metal pad 04 and the second metal pad 02 are located on the same side of the base substrate 01, and the distance between the first metal pad 04 and the base substrate 01 is greater than the distance between the second metal pad 02 and the base substrate 01.

The insulating layer 07 is located between the first metal pad 04 and the second metal pad 02, and the insulating layer 07 is completely disposed to cover the second metal pad 02.

Wherein a plane of the insulating layer 07 covering and being away from the second metal pad 02 is a first surface aa', and the first metal pad 04 is disposed to cover at least the boundary, close to the display area AA', of the first surface aa'.

In the electroluminescent display panel in accordance with the embodiments of the disclosure, cracks generated in the non-display area are prevented from extending into the display area by arranging a crack dam in the non-display area of the base substrate. In order to avoid the situation that many gradient angles are generated during manufacturing of film layers covering all the crack dam in the subsequent process, the display panel may be impacted by improper operation in the subsequent process, or cracks are liable to be generated at the gradient angle positions during fitting of an encapsulation cover plate, the first metal pads are disposed to cover at least the boundary, close to the display area, of the first surface, thus the number of the gradient angles can be reduced when the other film layers covering the metal pads are manufactured in the subsequent process, then the stress concentration positions are reduced, the probability of cracking of the display panel is decreased, and the service life of the display device is prolonged.

In specific embodiments, in the electroluminescent display panel in accordance with the embodiments of the disclosure, a gate insulating layer can be used as the insulating layer of the electroluminescent display panel, and the gate insulating layer is the same as the gate insulating layer of the related art and is not described in detail herein.

Figure 2:
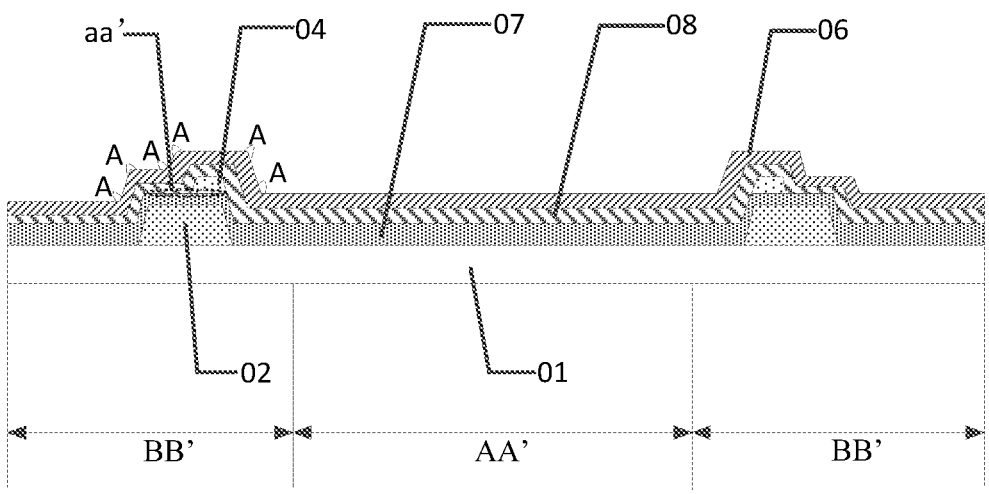
FIG. 2 is a first schematic structural diagram of an electroluminescent display panel in accordance with an embodiment of the disclosure.

Optionally, in the electroluminescent display panel in accordance with the embodiments of the disclosure, the orthographic projection of the first metal pad on the base substrate is disposed to cover the boundary, close to the display area, of the first surface, as shown in FIG. 2, the side surface, close to the boundary of the display area AA', of the metal pad 04 is flush with the side surface, close to the display area AA', the portion of the insulating layer 07 covering the second metal pad 02, and thus gradient angles A can be reduced when the other film layers are manufactured on the side of the first metal pad 04 away from the base substrate 01.

Figure 3:
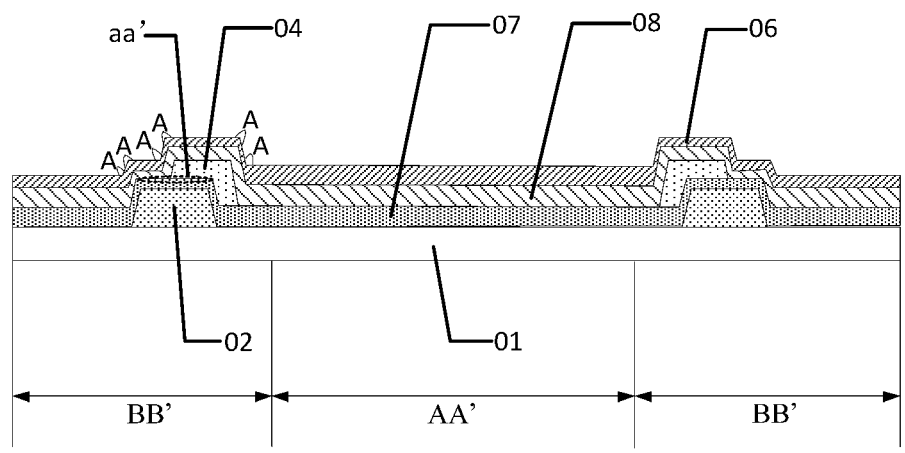
FIG. 3 is a second schematic structural diagram of an electroluminescent display panel in accordance with an embodiment of the disclosure.

Optionally, in the electroluminescent display panel in accordance with the embodiments of the disclosure, the orthographic projection of the first metal pad on the base substrate is disposed to cover the boundary, close to the display area, of the first surface, as shown in FIG. 3, the first metal pad 04 is disposed to cover the boundary, close to the display area AA', of the first surface aa' and also is disposed to cover the side surface connected with the boundary. In this way, the number of gradient angles A can be reduced, and the precision requirement for the manufacturing process is low, that is, the difficulty of the production process is lowered.

It should be noted that the electroluminescent display panel in accordance with the embodiments of the disclosure is illustrated with two metal pads as examples, and the number of the metal pads can be greater than two and is not limited.

Optionally, in the electroluminescent display panel in accordance with the embodiment of the disclosure, as shown in FIGS. 2 to 5, the crack dam further includes a protective layer 08 covering the metal pads.

It should be noted that in the electroluminescent display panel in accordance with the embodiment of the disclosure, an interlayer dielectric layer can be used as the protective layer of the display panel, and the interlayer dielectric layer is the same as an interlayer dielectric layer of the related art and is not described in detail herein.

Optionally, in order to prevent moisture from diffusing into the display panel, the electroluminescent display panel in accordance with the embodiment of the disclosure, as shown in FIGS. 2 to 5, further includes an encapsulation layer 06, the encapsulation layer 06 is on a side of protective layer 08 away from the base substrate 01 and is disposed to cover the protective layer 08.

In a specific implementation, as shown in FIG. 2 and FIG. 3, in the electroluminescent display panel in accordance with the embodiment of the disclosure, in the portion, close to the display area AA', of the crack dam of the non-display area BB', due to that the orthographic projection of the first metal pad 04 on the base substrate 01 is disposed to cover the boundary of the first surface aa' close to the display area AA', when the protective layer 08 covering the first metal pad 04 is subsequently manufactured, only two gradient angles A are formed at the portion of the protective layer 08 close to the display area AA'; when the encapsulation layer 06 covering the protective layer 08 is manufactured on the display panel then, only two gradient angles A are formed at the portion of the encapsulation layer 06 close to the display area AA', therefore, compared with the related art (four gradient angles A are formed at the portion of the encapsulation layer 06 close to the display area AA', as show in FIG. 1), the number of the gradient angles A at the portion of the crack dam close to the display area AA' is significantly reduced, that is, the stress concentration positions are reduced, then the probability of cracking in the display panel is lowered, and the service life of display devices is prolonged.

Because the number of the gradient angles A at the portion, close to the display area AA', of the crack dam of the electroluminescent display panel shown in FIG. 2 and FIG. 3 is significantly reduced compared with the related art, the stress concentration positions are reduced, and the probability of cracking of the display panel is lowered, the number of the gradient angles A at the portion of the crack dam away from the display area AA' is the same as in the related art, then when the display panel is subjected to impact in a subsequent process, cracks are liable to be generated at the gradient angles of the crack dam away from the display area AA', and the cracks may extend to the display area AA'.

Figure 4:
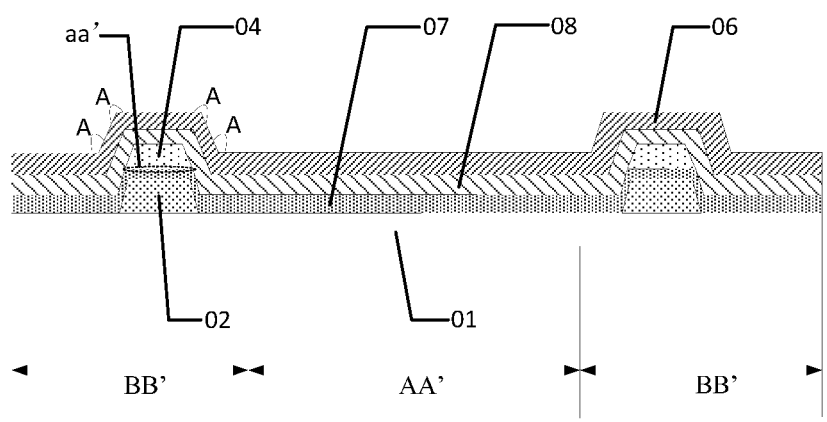
FIG. 4 is a third schematic structural diagram of an electroluminescent display panel in accordance with an embodiment of the disclosure.

Therefore, in order to further lower the probability of cracking of the display panel, in the electroluminescent display panel in accordance with the embodiment of the disclosure, as shown in FIG. 4, in the crack dam, the orthographic projection of the first metal pad 04 on the base substrate 01 is completely disposed to cover the orthographic projection of the first surface aa' on the base substrate 01. In this way, when the protective layer 08 covering the first metal pad 04 is formed in the subsequent process, only two gradient angles A are formed at the portion, close to the display area AA', of the protective layer 08 of the crack dam, and two gradient angles A are formed at the portion, away from the display area AA', of the protective layer 08 of the crack dam, accordingly, when the encapsulation layer 06 covering the protective layer 08 is further formed, only two gradient angles A are formed at the portion, close to the display area AA', of the encapsulation layer 06 and two gradient angles A are formed at the portion, away from the display area AA', of the encapsulation layer 06, compared with the related art (four gradient angles A are formed at the portion, close to the display area AA', of the encapsulation layer 06 of the crack dam and four gradient angles A are formed at the portion, away from the display area AA', of the encapsulation layer 06 of the crack dam, as shown in FIG. 1), the number of the gradient angles A is significantly reduced, that is, the stress concentration positions are reduced, then the probability of cracking of the display panel is further lowered, and the service life of the display device is prolonged.

Although the orthographic projection of the first metal pad 04 on the base substrate 01 is just completely disposed to cover the orthographic projection of the first surface aa' on the base substrate 01, as shown in FIG. 4, when the protective layer 08 covering the first metal pad 04 and the encapsulation layer 06 covering the protective layer 08 are manufactured in subsequent processes, the number of the gradient angles A formed at the encapsulation layer 06 can be reduced. But in the actual manufacturing process, it is difficult to achieve that the orthographic projection of the first metal pad 04 on the base substrate 01 is completely disposed to cover the orthographic projection of the first surface aa' of the insulating layer 07 adjacent to the first metal pad 04 on the base substrate 01.

Figure 5:
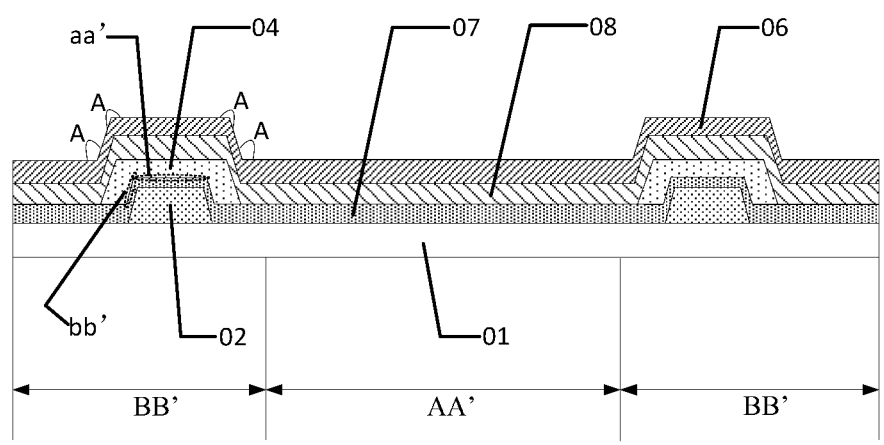
FIG. 5 is a fourth schematic structural diagram of an electroluminescent display panel accordance with an embodiment of the disclosure.

Therefore, in the electroluminescent display panel in accordance with the embodiment of the disclosure, as shown in FIG. 5, the orthographic projection of the first metal pad 04 on the base substrate 01 is further disposed to cover the orthographic projection of the side surface bb', connected with the first surface aa', of the insulating layer 07 on the base substrate 01. In this way, the same effect as that shown in FIG. 4 can be achieved, that is, the number of gradient angles A at the portions, close to the display area AA' and away from the display area AA', of the protective layer 08 and the encapsulation layer 06 of the crack dam is reduced, and the manufacturing process is quite easy to complete.

Optionally, the thickness of the first metal pad of the electroluminescent display panel in accordance with the embodiments of the disclosure can be 0.2-0.3 μm and is not limited herein.

Optionally, the thickness of the second metal pad of the electroluminescent display panel in accordance with the embodiments of the disclosure can be 0.2-0.3 μm and is not limited herein.

Optionally, in the electroluminescent display panel in accordance with the embodiments of the disclosure, as shown in FIGS. 2 to 5, the first metal pad 04 and the source and drain electrodes can be arranged on the same layer, that is, the pattern of the first metal pad 04 and the pattern of the source and drain electrodes of a driver transistor located in the display area are formed by the same material through the same patterning process, so that the manufacturing process of the electroluminescent display panel can be simplified, the manufacturing cost of the electroluminescent display panel can be reduced, and the overall thickness of the electroluminescent display panel is decreased.

Optionally, in the electroluminescent display panel in accordance with the embodiments of the disclosure, as shown in FIGS. 2 to 5, the second metal pad 02 may be arranged on the same layer as the gate electrode, that is, the pattern of the second metal pad 02 and the pattern of the gate electrode of the driver transistor of the display area are formed by the same material through the same patterning process, thus, the manufacturing process of the electroluminescent display panel can be simplified, the manufacturing cost of the electroluminescent display panel can be reduced, and the overall thickness of the electroluminescent display panel is decreased.

It should be noted that the electroluminescent display panel in accordance with the embodiments of the disclosure further includes other functional film layers which are the same as in the related art and will not be described in detail herein.

Based on the same inventive concept, an embodiment of the disclosure further provides a manufacturing method of the electroluminescent display panel, including the following the steps.

At least two metal pads are formed on a non-display area of a base substrate; the at least two metal pads includes a first metal pad and a second metal pad; the first metal pad and the second metal pad are located on the same side of the base substrate; and the distance between the first metal pad and the base substrate is greater than the distance between the second metal pad and the base substrate.

An insulating layer is formed between the first metal pad and the second metal pad. The insulating layer is completely disposed to cover the second metal pad.

Wherein a plane of the insulating layer covering and being away from the second metal pad is a first surface, and the first metal pad is disposed to cover at least the boundary, close to the display area, of the first surface.

The manufacturing method of the electroluminescent display panel in accordance with the embodiments of the disclosure, cracks generated in the non-display area are prevented from extending into the display area by arranging a crack dam in the non-display area of the base substrate. In order to avoid the situation that gradient angles are generated during manufacturing of film layers covering all the crack dam in the subsequent process, the display panel may be impacted by improper operation in the subsequent process, or cracks are liable to be generated at the gradient angle positions during fitting of an encapsulation cover plate, the first metal pads cover at least the boundary, close to the display area, of the first surface, thus, the number of the gradient angles can be reduced when the other film layers covering the metal pads are manufactured in the subsequent process, then the stress concentration positions are reduced, the probability of cracking of the display panel is decreased, and the service life of the display device is prolonged.

Optionally, in the manufacturing method of the electroluminescent display panel in accordance with the embodiments of the disclosure, the pattern of the first metal pad and the pattern of the source and drain electrodes are formed through one patterning process. In this way, the manufacturing process of the electroluminescent display panel can be simplified, the manufacturing cost of the electroluminescent display panel can be reduced, and the overall thickness of the electroluminescent display panel can be decreased.

Optionally, in the manufacturing method of the electroluminescent display panel in accordance with the embodiments of the disclosure, the pattern of the second metal pad and the pattern of the gate electrode are formed through one patterning process. In this way, the manufacturing process of the electroluminescent display panel can be simplified, the manufacturing cost of the electroluminescent display panel can be reduced, and the overall thickness of the electroluminescent display panel can be decreased.

The manufacturing method of the electroluminescent display panel in accordance with the embodiments of the disclosure will be described in detail below by taking the structure of the electroluminescent display panel shown in FIG. 5 as an example.

The manufacturing method of the electroluminescent display panel of FIG. 5 includes the following steps.

Figure 6A:
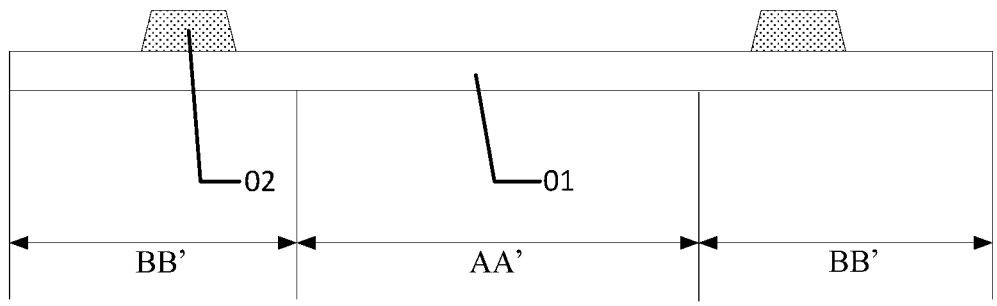
FIGS. 6a-6d are schematic structural diagrams showing steps in the method for manufacturing the electroluminescent display panel shown in FIG. 5 in accordance with the embodiments of the disclosure.

(1) Second metal pads 02 are formed on a non-display area BB' of a base substrate 01, as shown in FIG. 6*a*.

Figure 6B:
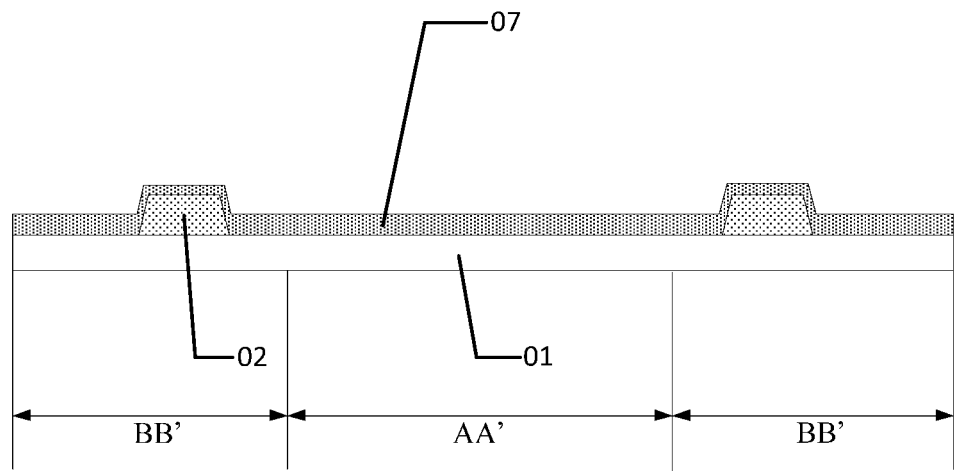

(2) An insulating layer 07 completely covering the second metal pads 02 is formed on the base substrate 01 where the second metal pads 02 are formed, as shown in FIG. 6*b*; specifically, the second metal pads 02 can be arranged on the same layer as a gate electrode (which is not specifically shown in the figure) of a driver transistor located in a display area AA', that is, the pattern of the second metal pads 02 and the pattern of the gate electrode are formed by the same material through the same patterning process, thus, the manufacturing process of the electroluminescent display panel can be simplified, the manufacturing cost of the electroluminescent display panel is reduced, and the overall thickness of the electroluminescent display panel is decreased.

Figure 6C:
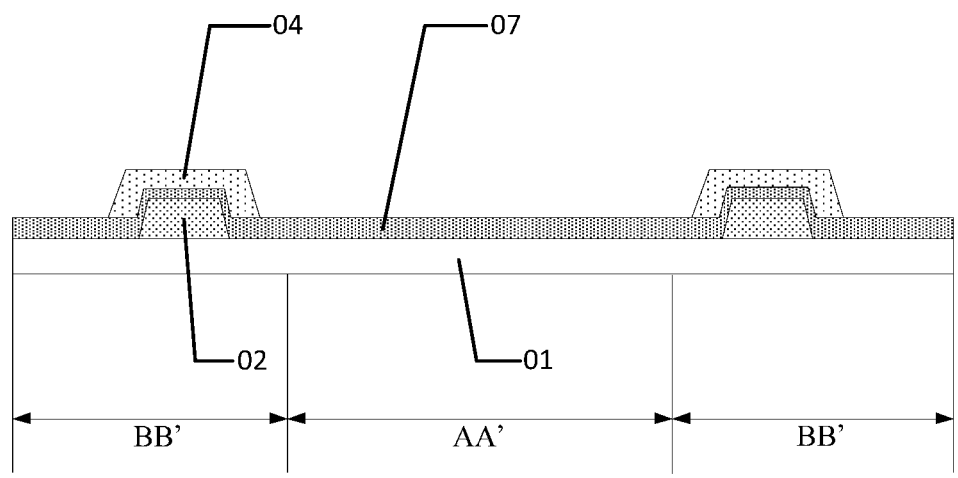

(3) First metal pads 04 are formed on the base substrate 01 where the insulating layer 07 is formed, wherein a plane of the insulating layer 07 covering and being away from the second metal pad 02 is a first surface aa'; the first metal pad 04 covers at least the boundary, close to the display area AA', of the first surface aa', as shown in FIG. 6*c*; specifically, the pattern of the first metal pads 04 and the pattern of source and drain electrodes (which are not specifically shown in the figure) of a driver transistor located in the display area AA' are formed by the same material through the same patterning process, thus, the manufacturing process of the electroluminescent display panel can be simplified, the manufacturing cost of the electroluminescent display panel is reduced, and the overall thickness of the electroluminescent display panel is decreased.

Figure 6D:
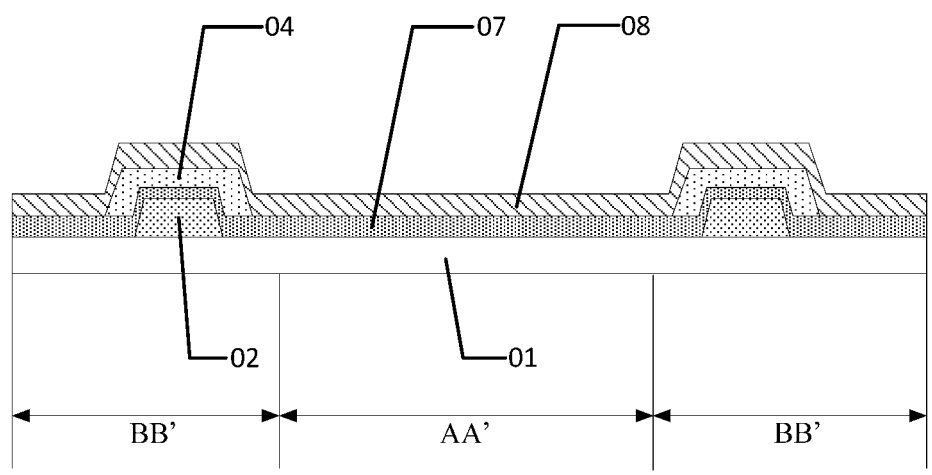

(4) A protective layer 08 is formed on the base substrate 01 where the first metal pads 04 are formed, as shown in FIG. 6*d*.

(5) An encapsulation layer 06 is formed on the base substrate 01 where the protective layer 08 is formed, as shown in FIG. 5.

The electroluminescent display panel shown in FIG. 5 according to the embodiments of the disclosure can be obtained through the steps (1) to (5).

It should be noted that in the manufacturing method of the electroluminescent display panel in accordance with the embodiments of the disclosure, the patterning process can include only a photolithography process or can include a photolithography process and an etching step, and can also include other processes for forming predetermined patterns such as printing and inkjet; the photolithography process refers to a pattern forming process including processes such as film formation, exposure, development and adopting a photoresist, a mask, an exposure machine and the like. In specific embodiments, the corresponding patterning process can be selected according to the structure formed in the disclosure.

Based on the same inventive concept, an embodiment of the disclosure further provides a display device which includes any electroluminescent display panel in accordance with the embodiments of the disclosure. The problem solving principle of the display device is similar to that of the foregoing electroluminescent display panel. Therefore, implementation of the display device can refer to implementation of the foregoing electroluminescent display panel, and the repeated description is not repeated herein.

In specific embodiments, the display device in accordance with the embodiments of the disclosure can be OLED display panel.

In specific embodiments, the display device in accordance with the embodiments of the disclosure can be any product or component with a display function, such as a mobile phone, a tablet computer, a television, a display, a notebook computer, a digital photo frame and a navigator. Other indispensable components of the display device are understood by those skilled in the art, are not described herein and shall not be construed as limiting the disclosure.

In the electroluminescent display panel, the manufacturing method thereof and the display device in accordance with the embodiments of the disclosure, the cracks generated in the non-display area are prevented from extending into the display area by arranging the crack dam in the non-display area of the base substrate. In order to avoid the situation that due to many gradient angles are generated during manufacturing of film layers covering all the crack dam in the subsequent process, the display panel may be impacted by improper operation in the subsequent process, or cracks are liable to be generated at the gradient angle positions during fitting of an encapsulation cover plate, the first metal pad covers at least the boundary, close to the display area, of the first surface, thus the number of the gradient angles can be reduced when the other film layers covering the metal pads are manufactured in the subsequent process, then the stress concentration positions are reduced, the probability of cracking of the display panel is decreased, and the service life of the display device is prolonged.

It will be apparent to those skilled in the art that various changes and modifications can be made to the disclosure without departing from the spirit and scope of the disclosure. Thus, if these modifications and variations of the disclosure fall within the scope of the claims of the disclosure and the equivalent technologies, the disclosure is also intended to include these modifications and variations.

The invention claimed is:

1. An electroluminescent display panel, comprising:
a display area, and
a non-display area surrounding the display area;
wherein the non-display area is provided with at least one crack dam on a base substrate, the crack dam comprises at least two stacked metal pads and an insulating layer, and the at least two metal pads comprises a first metal pad and a second metal pad;
the first metal pad and the second metal pad are located on a same side of the base substrate, and a distance between the first metal pad and the base substrate is greater than a distance between the second metal pad and the base substrate; and
the insulating layer is between the first metal pad and the second metal pad, and the insulating layer is disposed to cover the second metal pad completely;
wherein a surface of the insulating layer parallel to the base substrate, being disposed to cover and being away from the second metal pad, is a first surface;
wherein the first metal pad is disposed to only cover a boundary of the first surface and a side surface of the insulating layer, the boundary of the first surface is close to the display area, and the side surface is connected with the boundary and close to the display area.

2. The electroluminescent display panel according to claim 1, wherein the crack dam further comprises a protective layer being disposed to cover the metal pads.

3. The electroluminescent display panel according to claim 2, further comprises an encapsulation layer being on a side of the protective layer away from the base substrate and being disposed to cover the protective layer.

4. The electroluminescent display panel according to claim 1, wherein the metal pads in the crack dam are two metal pads.

5. The electroluminescent display panel according to claim 4, wherein the first metal pad is in a same layer as source and drain electrodes.

6. The electroluminescent display panel according to claim 4, wherein the second metal pad is in a same layer as a gate electrode.

7. A display device, comprising the electroluminescent display panel according to claim 1.

8. A manufacturing method of the electroluminescent display panel according to claim 1, comprising:
forming at least two metal pads on the non-display area of the base substrate, wherein the at least two metal pads comprise the first metal pad and the second metal pad, the first metal pad and the second metal pad are on a same side of the base substrate, and the distance between the first metal pad and the base substrate is greater than the distance between the second metal pad and the base substrate; and
forming the insulating layer between the first metal pad and the second metal pad, wherein the insulating layer is disposed to cover the second metal pad completely;
wherein a surface of the insulating layer parallel to the base substrate, being disposed to cover and being away from the second metal pad, is the first surface;
wherein the first metal pad is disposed to only cover a boundary of the first surface and a side surface of the insulating layer, the boundary of the first surface is close to the display area, and the side surface is connected with the boundary and close to the display area.

9. The manufacturing method according to claim 8, wherein a pattern of the first metal pad and a pattern of the source and drain electrodes are formed through one patterning process.

10. The manufacturing method according to claim 8, wherein a pattern of the second metal pad and a pattern of the gate electrode are formed through one patterning process.

* * * * *